United States Patent [19]

Musa et al.

[11] 4,328,558
[45] May 4, 1982

[54] RAM ADDRESS ENABLE CIRCUIT FOR A MICROPROCESSOR HAVING AN ON-CHIP RAM

[75] Inventors: Fuad H. Musa; Pern Shaw, both of Austin, Tex.

[73] Assignee: Motorola, Inc., Schaumburg, Ill.

[21] Appl. No.: 884,944

[22] Filed: Mar. 9, 1978

[51] Int. Cl.³ .............................................. G06F 9/22
[52] U.S. Cl. ...................................... 364/900; 307/518
[58] Field of Search ... 364/200 MS File, 900 MS File; 307/205, 208, 215, 267, DIG. 5, 265, 268, 203, 260, 269, 293, 234, 510, 518; 328/55, 56, 58, 99; 365/230, 233; 328/110, 112

[56] References Cited

U.S. PATENT DOCUMENTS

| | | | |
|---|---|---|---|
| 2,984,789 | 5/1961 | O'Brien | 307/518 X |
| 3,229,258 | 1/1966 | Heibeck et al. | 365/233 X |
| 3,619,790 | 11/1971 | Brooksbank | 328/99 |
| 3,624,519 | 11/1971 | Beydler | 328/56 X |
| 3,628,065 | 12/1971 | Hill | 307/208 X |
| 3,728,635 | 4/1973 | Eisenberg | 328/55 |
| 3,735,270 | 5/1973 | Holub | 328/55 |
| 3,736,567 | 5/1973 | Lotan et al. | 364/200 |
| 3,737,637 | 6/1973 | Frankeny et al. | 328/56 X |
| 3,792,355 | 2/1974 | Miyata et al. | 328/56 X |
| 3,792,362 | 2/1974 | Grant | 307/208 X |
| 3,862,440 | 1/1975 | Suzuki et al. | 328/58 X |
| 3,894,247 | 7/1975 | DeJong | 307/215 X |
| 3,919,695 | 11/1975 | Gooding | 364/200 |
| 3,925,735 | 12/1975 | Dzeki et al. | 307/268 X |
| 3,947,829 | 3/1976 | Suzuki | 307/215 X |
| 3,959,781 | 5/1976 | Mehta et al. | 307/DIG. 5 X |
| 3,969,706 | 7/1976 | Proebsting et al. | 365/233 X |
| 3,970,944 | 7/1976 | Huellwegen | 307/268 X |
| 4,035,663 | 7/1977 | Stodola | 307/208 |
| 4,050,096 | 9/1977 | Bennett et al. | 364/200 |
| 4,061,975 | 12/1977 | Sugai | 307/265 X |
| 4,063,117 | 12/1977 | Laugesen et al. | 307/205 X |
| 4,063,308 | 12/1977 | Collins et al. | 364/200 |
| 4,069,429 | 10/1978 | White et al. | 307/215 X |
| 4,104,860 | 8/1978 | Stickel | 307/208 X |
| 4,110,639 | 8/1978 | Redwine | 307/DIG. 5 X |
| 4,122,361 | 10/1078 | Clemen et al. | 307/208 |

*Primary Examiner*—Harry E. Springborn
*Attorney, Agent, or Firm*—Joe E. Barbee

[57] ABSTRACT

A pulse generating circuit is coupled to an address decoder to provide the address enable signal to the address decoder. An input pulse is provided to the pulse generating circuit and the output of the pulse generating circuit is coupled to the address decoder. The output of the pulse generating circuit keeps the address decoder enabled until the trailing edge of the input pulse. Internal to the pulse generating circuit the input pulse is connected to a delay. The output of the delay is connected to a first NOR gate. Another input of the first NOR gate receives the input pulse. The output of the first NOR gate is connected to a second NOR gate. Another input of the second NOR gate also receives the input pulse. The output of the second NOR gate is the output of the pulse generating circuit which is coupled to the address decoder. The pulse generating circuit provides a momentary output pulse at the trailing edge of the input pulse to momentarily inhibit the address decoder. The pulse generating circuit is particularly useful, in a microprocessor having an on-chip RAM, to inhibit the RAM address decoder at the trailing edge of a signal derived from a microprocessor clock thereby virtually eliminating instability problems of the RAM.

8 Claims, 4 Drawing Figures

RAM ADDRESS ENABLE CIRCUIT FOR A MICROPROCESSOR HAVING AN ON-CHIP RAM

CROSS REFERENCE TO RELATED APPLICATIONS

For related applications see "RAM Retention During Power Up and Power Down" application Ser. No. 884,790, now U.S. Pat. No. 4,145,761 and "On Chip RAM Interconnect to MPU Bus" application Ser. No. 884,947, both assigned to the same assignee and filed on the same date as the present application.

BACKGROUND OF THE INVENTION

This invention relates, in general, to microprocessors, and more particularly, to those microprocessors having an on-chip random access memory (RAM).

Microprocessors have gained wide acceptance and have proven very useful in many applications. In most cases, a microprocessor is used in conjunction with external memories which contain instructions and opcodes. Advances in LSI techniques have allowed inclusion of memories on the same chip as a microprocessor; however, the memories had limited utility since they were mainly used for temporary storage of data. It would be highly desirable to have a random access memory (RAM) located on the same integrated circuit chip as the microprocessor and interconnected in a manner to allow data from the RAM to be inputted onto the internal microprocessor data bus. In addition, in many applications it is desirable to be able to retain some of the information contained in the RAM when the microprocessor power is down. This is particularly true of microprocessors used in automobiles.

It is an object of the present invention to provide a RAM address enable circuit which inhibits the RAM address decoder at the trailing edge of a signal derived from a microprocessor clock.

Another object of the present invention is to virtually eliminate instability problems of a RAM caused by charge splitting and coupling and by multiple select and deselect.

SUMMARY OF THE INVENTION

In carrying out the above and other objects of the invention in one form, there is provided a pulse generating circuit to provide an address enable signal. The address enable signal is coupled to an address decoder. The address decoder is coupled to bit or row select lines of a RAM. Delay means provide a delay to an input signal to the pulse generating circuit. A first logic gate is coupled to the delay means. Also coupled to the first logic gate is the input signal. The output of the first logic gate is coupled to a second logic gate. Another input of the second logic gate is coupled to the input signal. The output of the second logic gate is the address enable signal and is coupled to the address decoder. The pulse generating circuit provides an address enable signal until the trailing edge of the input signal occurs at which time the pulse generating circuit momentarily generates an output pulse which inhibits the address decoder.

The subject matter which is regarded as the invention is set forth in the appended claims. The invention itself, however, together with further objects and advantages thereof, may be better understood by referring to the following detailed description taken in conjunction with the accompanying drawings.

The exemplification set out herein illustrates the preferred embodiment of the invention in one form thereof, and such exemplification is not to be construed as limiting in any manner.

DESCRIPTION OF THE PREFERRED EMBODIMENTS

Placing a RAM on the same integrated circuit chip as a microprocessor makes greater use of the integrated circuit chip area. However, being able to input data from the RAM onto a microprocessor internal bus greatly enhances the utility of the chip. A method for entering data from a RAM to a microprocessor when the RAM and microprocessor are contained on a single integrated circuit chip includes selecting data from a RAM location, and coupling the data from a sense amplifier to a bilateral switch. The bilateral switch is then controllably switched to permit the data from the RAM to be transferred to the microprocessor data bus. The data is then accessible to the instruction register of the microprocessor thereby permitting the RAM to contain instructions and operation codes. A portion or all of the RAM can be powered by a standby power supply which remains energized when the microprocessor's power is removed. This permits the RAM to retain the data stored therein. Access to the RAM during power up and power down conditions is inhibited to ensure that the data contained within the RAM is not destroyed nor modified.

Figure 1:
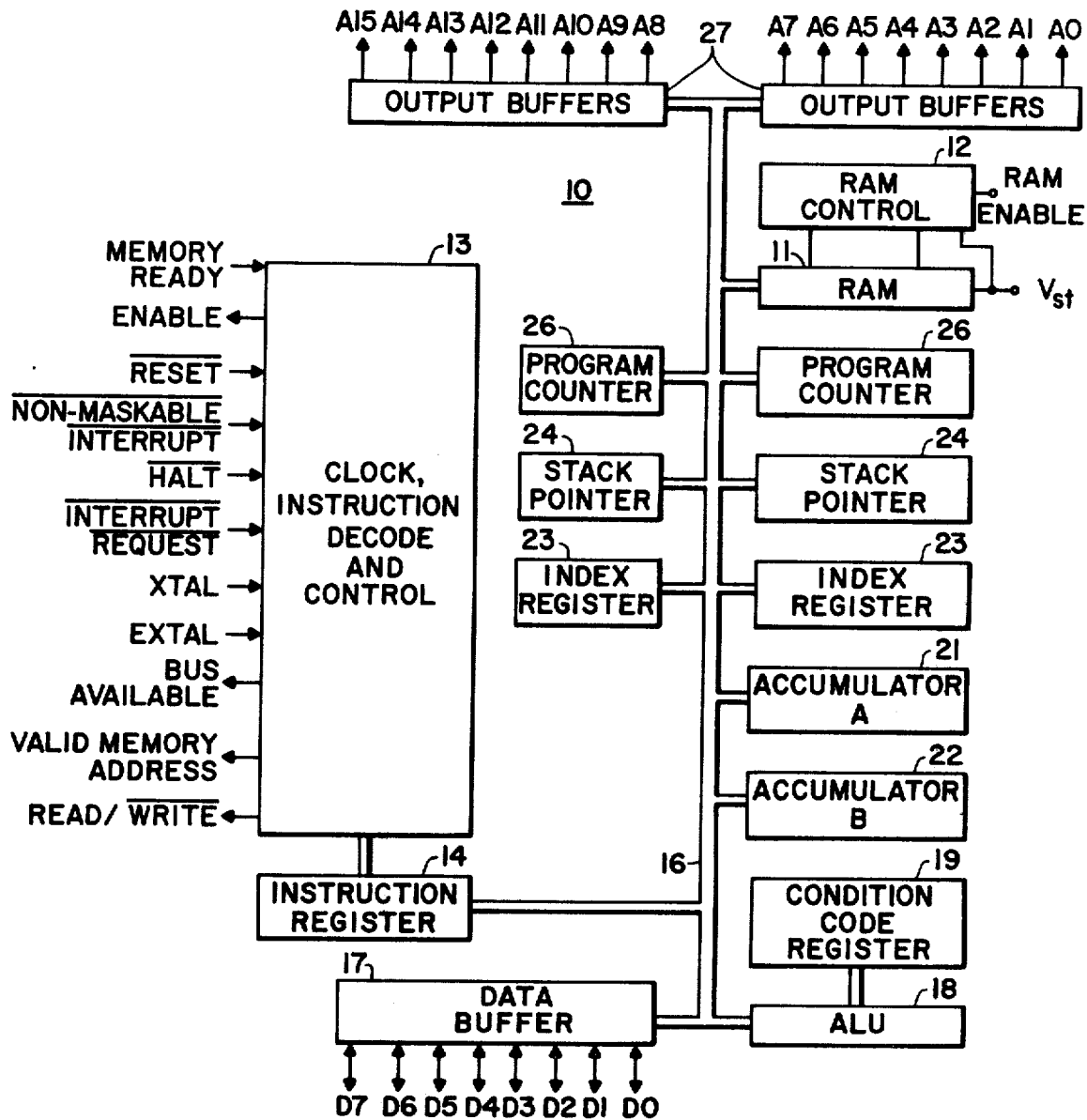
FIG. 1 is a block diagram of a microprocessor having an on-chip RAM.

FIG. 1 illustrates a microprocessor unit (MPU) 10 along with RAM 11 all being on the same integrated circuit chip. Associated with RAM 11 is RAM control unit 12. A portion of the RAM or all of the RAM if desired can be powered by a standby voltage $V_{ST}$. Access to the RAM is controlled by a RAM enable signal supplied to RAM control 12. The microprocessor contains clock, instruction decode, and control circuitry 13 which is connected to an internal microprocessor data bus 16 by way of an instruction register 14. Instruction decoding control circuitry 13 receives several external signals which will be discussed in greater detail hereinafter. Data is inputted and outputted to the microprocessor by way of data buffers 17.

A condition code register 19 is coupled to arithmetic logic unit 18 and indicates the results of arithmetic logic unit 18. The results generated by condition code register 19 are in bit form and can be used as testable conditions such as conditional branch instructions. Program counter 26 is a two byte (for example, 16-bits) register that points to a current program address. Stack pointer 24 is a two byte register that contains the address of the next available location in an external pushdown/pop-up stack. The external stack is normally a random access read/write memory that may have any location or address that is convenient. The microprocessor also contains an index register 23 which is a two byte register used to store data or a sixteen bit memory address for the index mode of memory addressing. Microprocessor unit 10 contains two 8 bit accumulators 21 and 22 that are used to hold operands and results from arithmetic logic unit 18. Program counter 26, stack pointer 24, index register 23, accumulators 21 and 22, and arithmetic logic unit 18 are all connected to internal microprocessor data bus 16. Microprocessor data bus 16 is also connected to address or output buffers 27. Sixteen output pins are used for the address bus. Output or external data buffer 17 uses eight pins and serves as a buffer for external data into and out of data bus 16. Data buffer 17 is bidirectional, transferring data to and from peripheral devices and external memories, if any. As will be more apparent hereinafter data buffer 17 includes eight individual buffers and its interface connections form a data bus for an external interface.

A complete schematic of microprocessor unit 10 without RAM 11 and RAM control 12 can be found in U.S. Pat. No. 3,962,682 to Thomas H. Bennett. U.S. Pat. No. 3,962,682 is assigned to the same assignee as the present invention and is hereby incorporated herein by reference. Microprocessor unit 10 is a small computer with an 8 bit data word and 16-bit memory addressing. $\overline{\text{Halt}}$ is an input to instruction decode and control unit 13. When $\overline{\text{Halt}}$ is in a logical low state or "0" state all activity in the microprocessor will be halted. Halt is level sensitive. In the halt mode, the microprocessor will stop at the end of an instruction, Bus Available will be in a high state, and Valid Memory Address (VMA) will be in a low state. The address bus which is connected to output buffers 27 will display the address of the next instruction. Read/$\overline{\text{Write}}$ (R/$\overline{\text{W}}$) is an output from control unit 13 and signals any peripheral units and external memory devices as to whether the microprocessor is in a read or write state. Read is a logic high level while write is a logic low. The normal standby state of Read/$\overline{\text{Write}}$ is a logical "1" or high state. Another output of control unit 13 is Valid Memory Address (VMA) which indicates to any peripheral devices that there is a valid address on the address bus. In normal operation, this signal should be used for enabling peripheral interfaces such as a peripheral interface adaptor (PIA) and asynchronous communications interface adaptor (ACIA). Another output of control unit 13 is a Bus Available signal which is normally in a logical low state. When the Bus Available (BA) signal is activated it will go to a logical high state indicating that the microprocessor has stopped and that the address bus is available. This will occur if the $\overline{\text{Halt}}$ line is in a logical low state or the microprocessor is in the WAIT state as a result of the execution of a WAIT instruction. Interrupt Request ($\overline{\text{IRQ}}$) is a level sensitive input to control unit 13 which requests that an interrupt sequence be generated within the microprocessor. The processor will wait until it completes the current instruction that is being executed before it recognizes the request. Once the interrupt request is recognized the microprocessor will begin an interrupt sequence provided an interrupt mask bit in condition code register 19 is not set. Data in index register 23, program counter 26, accumulators 21 and 22, and condition code register 19 are stored away in a stack memory. The microprocessor will then respond to the interrupt request by setting the interrupt mask bit high so that no further interrupts may occur. At the end of the cycle, a 16-bit address will be loaded that points to a vectoring address which is located in predetermined memory locations. An address loaded at these predetermined memory locations causes the microprocessor to branch to an interrupt routine in memory. The $\overline{\text{Halt}}$ line must be in a logical high state for interrupts to be recognized.

A $\overline{\text{Reset}}$ input to control unit 13 is used to reset and start the microprocessor from a power down condition. When the $\overline{\text{Reset}}$ input is in a logical low state the microprocessor unit is inactive and the information in the registers will be lost. If a logical high level is detected on the $\overline{\text{Reset}}$ input, the microprocessor will begin the restart sequence and all the higher order address lines will be forced high. During the restart routine, the interrupt mask bit is set and must be reset before the microprocessor can be interrupted by $\overline{\text{Interrupt Request}}$. A Non-Maskable Interrupt ($\overline{\text{NMI}}$) signal is also inputted to control unit 13. A low going edge on the Non-Maskable Interrupt input requests that a non-mask-interrupt sequence be generated within the microprocessor. As with the $\overline{\text{Interrupt Requests}}$ signal, the microprocessor will complete the current instruction that is being executed before it recognizes the Non-Maskable Interrupt signal. The interrupt mask bit in condition code register 19 has no effect on the Non-Maskable Interrupt signal. The Interrupt Request and Non-Maskable Interrupt inputs are hardwire interrupt lines that are sampled when an enable signal is in a logical high state and will start the interrupt routine on a logical low enable signal following the completion of an instruction. The enable signal is an input to the control unit and supplies the clock signal for the microprocessor unit and the rest of the system.

An Xtal and EXtal inputs are also provided for control unit 13 and may be used for a series resonant fundamental crystal to provide crystal control for an internal oscillator. Control unit 13 also has a Memory Ready input signal which allows stretching of the enable signal. When the Memory Ready signal is a logical high level, the enable signal will be in normal operation. When Memory Ready signal is a logical low level the enable signal may be stretched integral multiples of half periods, thus allowing interface to slow memories.

A RAM Enable input signal to RAM control unit 12 controls the on-chip RAM. When the RAM Enable input signal is a logical high state the on-chip memory is enabled to respond to the microprocessor controls. The RAM is disabled when the RAM enable signal is in a logical low state. As will be explained hereinafter the RAM Enable signal can be used to disable reading and writing the on-RAM chip during a power down situation. The RAM Enable signal should be in a logical low state three microseconds befoe the power to the microprocessor unit goes below a predetermined voltage level, such as 4.75, volts during power down. A standby power voltage, $V_{ST}$, supplies the DC voltage to the RAM as well as to the RAM control logic 12. If it is not desired or necessary for all of the information in the RAM to be retained during a power down condition, the standby voltage need only be applied to that portion of the RAM in which it is desired to retain data during a power down condition.

Figure 2:
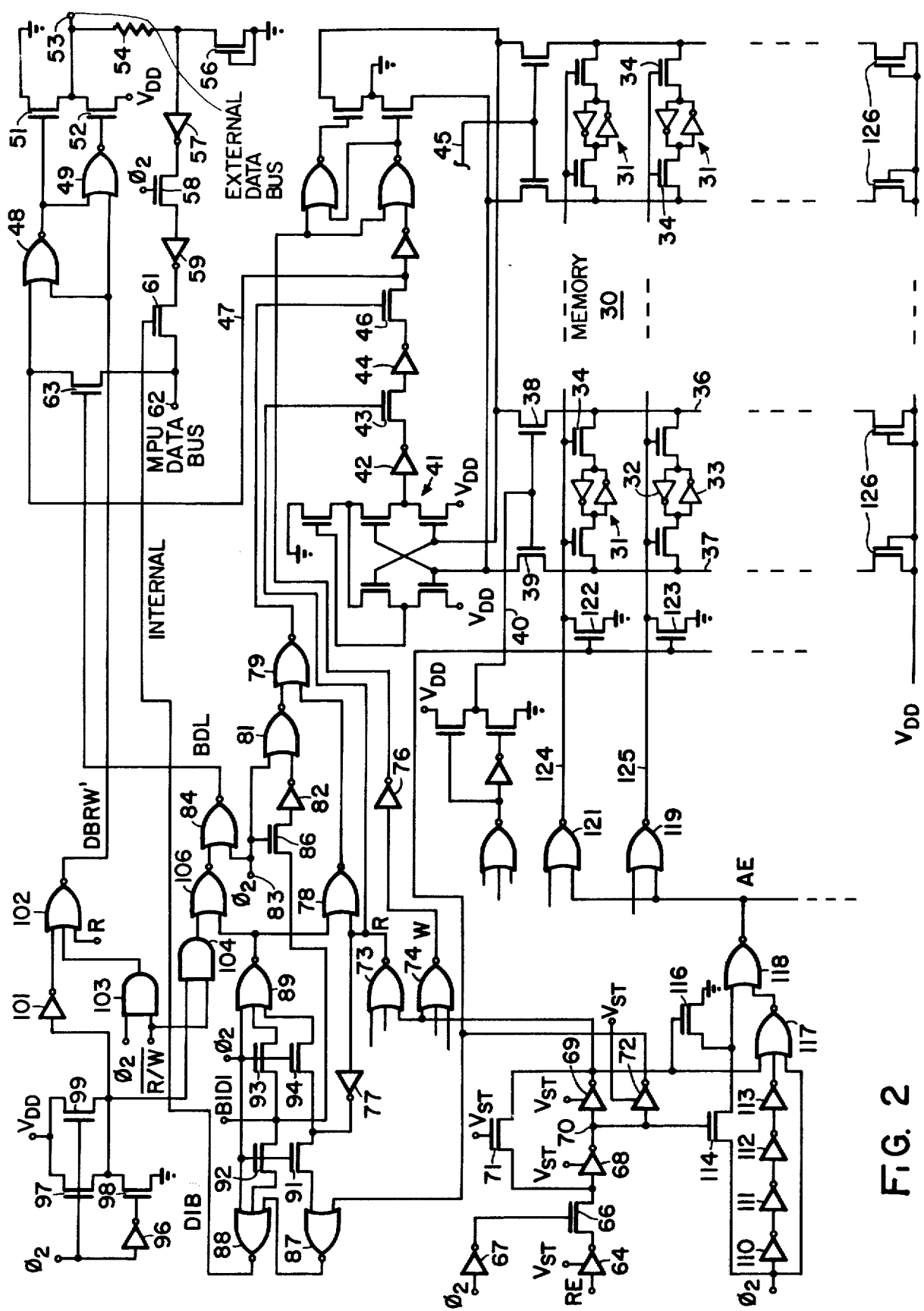
FIG. 2 is a logic diagram of a portion of the system of FIG. 1.

FIG. 2 illustrates in greater detail some of the circuitry of the system of FIG. 1. A portion of RAM 11 of FIG. 1 is illustrated as memory 30. In an 8-bit word system memory 30 would contain eight columns of memory cells 31. The eight columns would have one sense amplifier 41. Each memory cell 31 contains two inverters 32 and 33 connected back-to-back. Data stored in memory cells 31 is transferred to column sense lines such as 36 and 37 by field effect transistor couplers 34. Couplers 34 are enabled by signals appearing on row select line 124 and 125. A memory array for an 8-bit word system would not only have eight columns of memory cells 31 but would also have a number of rows of memory cells, such as 16, and each row would have a row select line such as 124 and 125.

Sense lines 36 and 37 are coupled to sense amplifier 41 by field effect transistors 38 and 39 respectively. Transistors 38 and 39 are energized by a column select signal appearing on line 40. Each column will have its own column select signal lines such as 40 and 45. The output of cross coupled sense amplifier 41 is buffered by inverter 42. A read signal from logic NOR gate 73 enables field effect transistor 43 which couples the output of inverter buffer 42 to inverter 44. The output from buffer or inverter 44 is coupled by transistor 46 to line or conductor 47. Transistor 46 is enabled by a synchronous timing signal from logic NOR gate 79. Line or conductor 47 is connected to one input of logic NOR gate 48 while the other input of NOR gate 48 is connected to a timing signal. The output of logic NOR gate 48 goes to a control electrode of transistor 51 and to an input of NOR gate 49. NOR gate 49 also receives the same timing input signal as NOR gate 48. The output of NOR gate 49 is connected to a control electrode of transistor 52. Transistors 51 and 52 are connected in series between voltage source $V_{DD}$ and reference ground. A buffered output to the external data bus 53 is obtained from a node formed by the series connected transistors 51 and 52. Thus it can be seen that output data from the RAM can appear on external data bus 53. Each 8-bit section of the RAM memory has its own data buffer and external data bus terminal. The data out of the RAM carried by conductor 47 can also be coupled to the internal microprocessor data bus 62 by switching transistor 63 to a conductive state. Transistor 63 is controlled by an output signal from NOR gate 84. Data bus terminal 53 can also receive input data for the microprocessor. The input data is coupled by protection resistor 54, inverter buffer 57, clocked transistor 58 and buffer/inverter 59. The input data is then controllably switched by transistor 61 which is controlled by an output signal from NOR gate 88. Data from internal microprocessor data bus 62 can also be written into the RAM when transistor 63 is enabled. When data is desired to be written into the RAM, transistors 43 and 46, of course, will not be enabled. Data appearing on line 47 is coupled to a NOR gate by an inverter. The NOR gates are enabled by a "write" signal and are coupled to the column sense lines. The desired column sense lines can be enabled by signals on lines such as 40 or 45. The column sense lines are connected by pull up transistors 126 to a voltage line $V_{DD}$ so that the sense lines can be precharged.

The logic used to generate some of the read/write commands and data buffer enabling signals will now be discussed. A timing signal $\phi2'$ is coupled to control electrodes of transistors 97, 98, and 99. An inverter 96 inverts the signal to transistor 98. Transistors 97 and 98 are connected in series between ground and $V_{DD}$. Transistor 97 is in parallel with transistor 99. The output from transistors 97 and 98 is inverted by inverter 101 and connected to an input of NOR gate 102. The output also goes to an input of AND gate 104. NOR gate 102 also receives a read input, R, signal from NOR gate 73 and an input from AND gate 103. Clock signal $\phi2$ and a read/write signal are supplied to the inputs of AND gate 103. The read/write signal is also connected to an input of AND gate 104. The output of AND gate 104 goes to NOR gate 106. The output of NOR gate 106 is connected to an input of NOR gate 84. NOR gate 84 supplies the enable signal for switching transistor 63. Clock signal $\phi2$ appears on conductor 83 which is connected to an input of NOR gate 84. Conductor 83 also provides the enable signal for transistor 86 and an input for NOR gate 81. When transistor 86 is enabled it couples timing signal BID1 to inverter 82. Inverter 82 supplies an input for NOR gate 81 and the output of NOR gate 81 is an input for NOR gate 79. NOR gate 79 supplies a synchronizing signal for transistor 46 to enable the data out of the RAM to be coupled to the output buffer. Timing signal BID1 is coupled to NOR gates 88 and 89 by transistors 92 and 93 respectively. Transistors 92 and 93 are enabled by clock signal or clock pulse $\phi2$ which also serves as an input signal for NOR gates 88 and 89. The output of NOR gate 89 goes to NOR gate 106 and to NOR gate 78. The output of NOR gate 88 goes to transistor 61 which couples input data from external data bus 53 to the microprocessor internal data bus 62. NOR gate 88 has a third input coming from NOR gate 87, and NOR gate 89 also has a third input coming from inverter 77. The output of inverter 77 is coupled to inputs of NOR gates 87 and 89 by transistors 91 and 94, respectively. Transistors 91 and 94 are enabled by clock signal $\phi2$.

RAM Enable signal, RE, is received into the RAM control logic by inverter 64. The output of inverter buffer 64 is coupled by transistor 66 to a latch having inverters 68, 69, and transistor 71. Transistor 71 provides feedback, from the series connected inverters 68 and 69, by coupling the output of inverter 69 back to the input of inverter 68. Transistor 71 is enabled by standby voltage $V_{ST}$. An output is also taken from a node 70 formed by inverters 68 and 69 and is used to enable transistor 114 and to provide an input to inverter 72. Clock pulse $\phi2$ is coupled by inverter 67 to transistor 66 to provide an enable signal for transistor 66. It should be noted that inverters 64, 68, 69 and 72 are all powered by standby voltage, $V_{ST}$. The output of inverter 69 is the output for the latch and goes to NOR gates 73 and 74 to be NORed with other input signals to these NOR gates to produce the read and write signals for the RAM. The write signal appears at the output of NOR gate 74 and is inverted by inverter 76. The read signal from NOR gate 73 goes to inverter 77, NOR gate 78 and to transistor 43. The output of the latch also goes to a control or gate electrode of transistor 116 and to an input of NOR gate 117. Transistor 66 serves as a synchronous coupler coupling the RAM enable signal from buffer inverter 64 to the latch when transistor 66 is enabled by clock signal $\phi2$. The output taken from node 70 is coupled by inverter 72 to NOR gate 87 and to transistors connected to row select lines of the RAM such as transistors 122 and 123. Transistors 122 and 123 serve to discharge the row select lines and to hold these lines at a logic low level or ground whenever the control electrodes of the transistors are enabled by an output from inverter 72. The signal from inverter 72 is known as $\overline{\text{RAM Enable 2}}$ ($\overline{\text{RE2}}$).

Also illustrated in FIG. 2 is circuitry to generate an Address Enable signal, AE. Four series connected inverters 110, 111, 112, and 113 provide a delayed input to NOR gate 117. Clock signal $\phi2$ provides an input to the series of inverters in addition to providing another input for NOR gate 117. Clock pulse $\phi2$ is also coupled to an input of NOR gate 118. The output of NOR gate 117 provides a second input for NOR gate 118. Inverters 110, 111, 112, and 113 serve as a delay means for clock signal $\phi 2$. The amount of the delay provided by the inverters can be controlled to a certain extent by varying the physical size of the inverters. Of course, the delay can be further decreased by decreasing the number of inverters or increased by adding additional inverters or gates. The clock signal $\phi 2$ input to 118 is coupled through a transistor 114. Transistor 114 has its control electrode connected to the latch. The purpose of transistor 114 is to open up the line that carries clock signal $\phi 2$ to NOR gate 118 when the RAM Enable signal is not present. Transistor 116 is used to pull an input of NOR gate 118, that normally carries clock pulse $\phi 2$, to ground. Transistor 116 is activated when the RAM Enable signal is in a logic "0" state. This ensures a logic "0" input to NOR gate 118 when the RAM is not enabled. The output of NOR gate 118 provides an Address Enable signal which is connected to an address decoder depicted by NOR gates 119 and 121. It will be understood that the address decoder represented by NOR gates 119 and 121 will have other address coded inputs besides the Address Enable input.

When clock signal $\phi 2$ is in a logic "1" state, inverters 110, 111, 112 and 113 will provide a logic "1" level input to NOR gate 117 since there are an even number of inverters. Clock signal $\phi 2$ is already directly connected to the input of NOR gate 117. This will mean that NOR gate 117 now has two logic "1" levels on its input. The third input to NOR gate 117 will not have any influence on the output of NOR gate 117 and therefore its output will be a logic "0". This logic "0" appears on one of the inputs of NOR gate 118 and the other input of NOR gate 118 is clock pulse $\phi 2$ which was assumed to be a logic "1" level. Transistor 114 will be in a conducting state as long as the RAM Enable signal present at the input of inverter 64 is a logic "1". The inputs of gate 118 being a logic "1" and a logic "0" will cause a logic "0" at the output of NOR gate 118 and therefore does not serve to inhibit the address decoder.

At the trailing edge of clock pulse $\phi 2$ the directly connected input to gate 117 will go to a logic "0" level while the input coupled by the delay means will remain at a logic "1" level for a predetermined period of time equal to the amount of delay provided by inverters 110, 111, 112 and 113. Therefore the output of NOR gate 117 which is connected to NOR gate 118 will remain at a logic "0" level for the predetermined period of time, and the other input to NOR gate 118 which is directly connected to the clock pulse $\phi 2$ will become a logic "0" level thereby producing a logic "1" level at the output of NOR gate 118. This positive or logic "1" output is connected to the address decoder and serves to inhibit the address decoder for a period of time equal to the delay of inverters 110-113. During the short period of time that the Address Enable signal inhibits the address decoder the row select lines are held in a logical low state. This helps to alleviate the problem of charge splitting and coupling, which is sometimes called pattern sensitivity, caused by the address code changing at the input of the address decoder. Otherwise, the previous signal in the sense line could tend to change the state of the next address memory cell. During the time that the address decoder is inhibited, the sense lines are pulled up to a logic level "1" by pull up devices 126. Inhibiting the address decoder at the trailing edge of clock pulse $\phi 2$ also alleviates the multiple select/deselect problem which is caused by the overlapping of signals on the row select lines. Such overlapping can cause a new cell to be selected prior to a previously addressed sense line being completely deselected. The multiple select/deselect problem could also be caused should one decoder gate change outputs faster than another decoder gate which would cause a momentary erroneous address.

Since the RAM is on the same integrated circuit chip where the address is generated, process variations substantially cancel each other out. If process variations should tend to make the addressing circuitry slower operating, then of course, the sequential inverters 110, 111, 112, and 113 will then provide a longer delay and vice versa. The length of the delay provided by the sequential inverters should be at least equal to the time it takes an address signal to get from the address registers to the RAM address decoder. The important thing is to produce a pulse which is long enough to block out undesired address pulses, and as indicated hereinbefore one way of accomplishing this is by selecting the proper number of gates or inverters.

Just prior to a power down condition the RAM Enable signal and the clock pulse $\phi 2$ are commanded to a logic "0" state. This causes a logic "1" level to appear at the input of inverter 68 since synchronous coupler 66 is enabled by the logic "1" level coming from inverter 67. The output of inverter 69 will also be a logic "1" level and is coupled back to the input of inverter 68 by feedback coupling means 71. The logic "1" level from inverter 69 is connected to the inputs of the read and write logic gates which serves to inhibit the read and write logic circuitry. This prevents any information from being read into or out of the RAM in a power down condition. The output of inverter 68, which will be a logic "0" level, disables transistor 114 whereas transistor 116 is enabled by the output of inverter 69 thereby causing the input to NOR gate 118 to be a logic "0". The logic "1" on the output of inverter 69 is connected to an input of NOR gate 117 thereby causing NOR gate 117 to produce a logic "0" level output. The two logic "0's" on the input of NOR gate 118 causes its output to be a logic "1" thereby inhibiting the address decoder. The output of the address decoder pulls the row select lines to a "0" level. The output of inverter 68 is also connected to an input of inverter 72. The output of inverter 72 produces signal $\overline{RE2}$ which, as stated hereinbefore, activates transistors 122 and 123 further ensuring that the row select lines remain in a "0" state.

Figure 3:
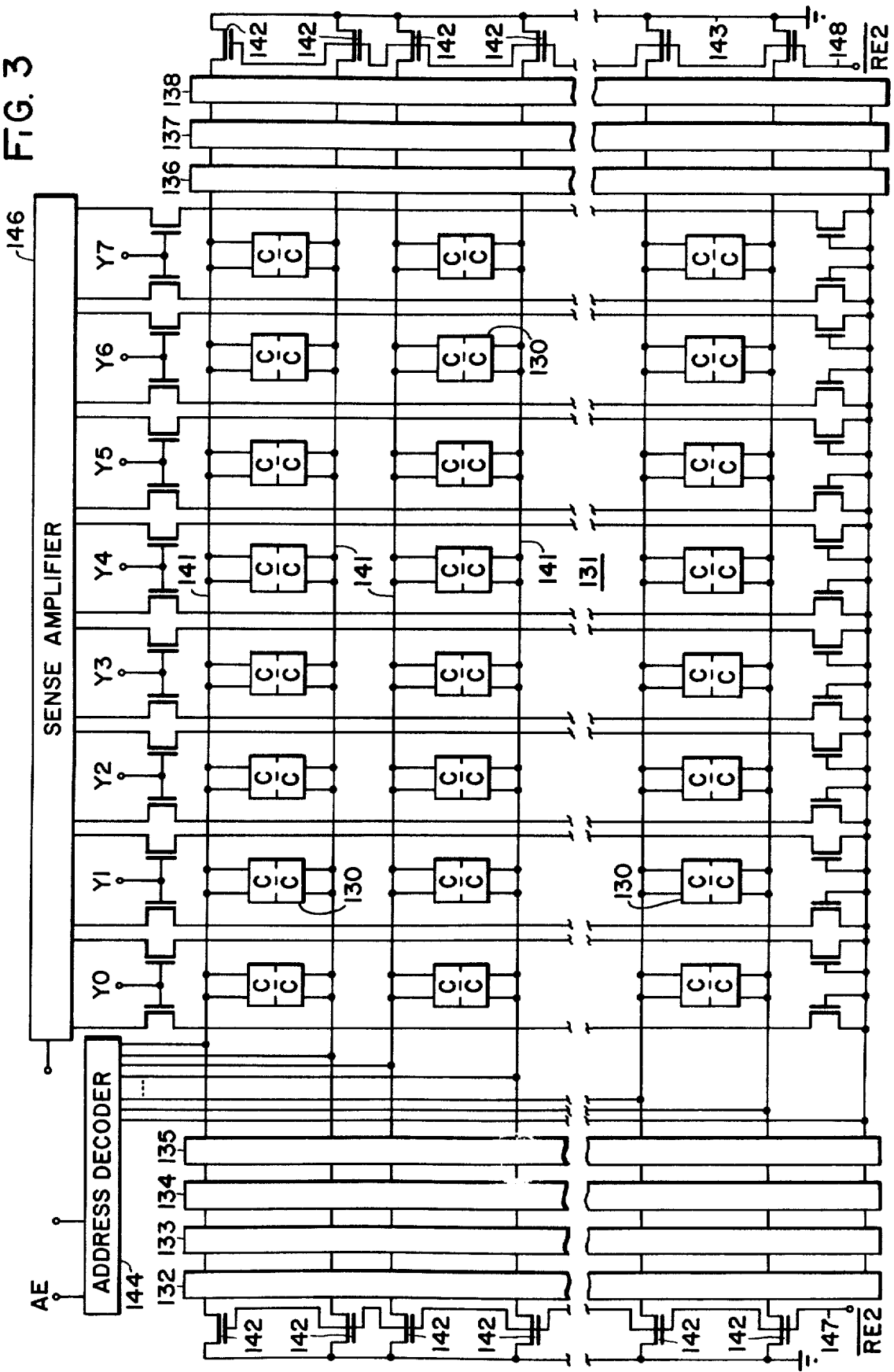
FIG. 3 is a block diagram of the RAM of FIG. 1.

FIG. 3 better illustrates the action of RE2 upon the row select lines. As shown in FIG. 3 transistors 142 perform the same function as the transistors illustrated as 122 and 123 in FIG. 2. It should be noted that transistors 142 are located at each end of the row select lines which therefore cause the row select lines to be pulled down to a "0" level at each end while the address decoder 144, which is connected to the midpoint of the row select lines, pulls the midpoint down to a "0" level. FIG. 3 illustrates eight different 8-bit groups of memory cells in the RAM. The eight groups are 131, 132, 133, 134, 135, 136, 137, and 138. Group 131 is shown in greater detail than the other groups. A plurality of memory cells 130 make up group 131. Each cell 130 is connected to address decoder 144 by row select lines 141. Row select lines 141 are coupled to a 0 volt reference or ground conductor 143 by transistors 142. The control electrodes of transistors 142 are connected to lines 147 and 148 which carry the $\overline{RE2}$ signal. The sense amplifier 146 of group 131 is coupled to selectable sense lines by command of signals Y0 through Y7.

Figure 4:
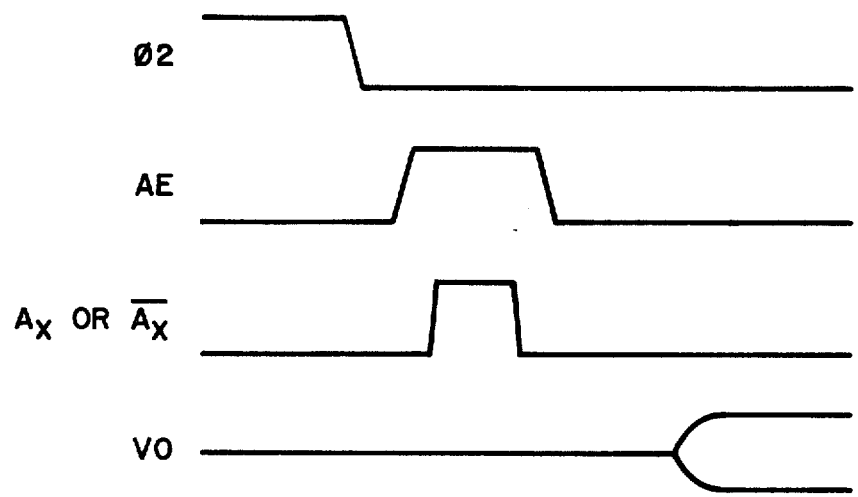
FIG. 4 is a timing diagram useful in understanding the operation of a portion of the circuitry illustrated in FIG. 2.

FIG. 4 illustrates the timing relationship that occurs when the Address Enable signal, AE, inhibits the address decoder. The top signal is clock pulse $\phi 2$ and when it goes low then the Address Enable signal goes to a logic "1" level. The Address Enable signal stays high for the length of time provided by the delay of the sequential inverters. The third from the top signal $A_X$ or $\overline{A_X}$ represents the address input to the address decoders. The X can be any number from zero to n where n is the highest numbered address. The bottom line indicates the output to the internal data bus. Note that the RAM output data, $V_O$, does not become valid until after the Address Enable signal returns to a low level.

By now it should be appreciated that there has been provided an on-chip RAM from which data can be outputted directly on to the internal microprocessor data bus. In addition, RAM retention is accomplished during power down and power up conditions and an address inhibit signal is applied to the address decoder during a period of time immediately following an addressed access to the RAM.

Consequently, while in accordance with the Patent Statutes, there has been described what at present are considered to be the preferred forms of the invention, it will be obvious to those skilled in the art that numerous changes and modifications may be made herein without departing from the spirit and scope of the invention, and it is therefore aimed in the following claims to cover all such modifications.

What is claimed as new and desired to secure by Letters Patent of the United States is:

1. A pulse generating circuit for generating a pulse to temporarily inhibit an address decoder, the generating circuit being a portion of a microprocessor having said address decoder, the circuit having an input and an output, comprising: means for producing an electrical delay, the means being coupled to the input of the circuit and providing an output; a first logic gate having at least a first and a second input and an output, the first input of the first logic gate being coupled to the output of the means for producing said electrical delay, the second input to the first logic gate being coupled to the input of the circuit; and a second logic gate having at least a first and a second input, the first input of the second logic gate being coupled to the output of the first logic gate and the second input to the second logic gate being coupled to the input of the circuit to at said output of the generating circuit provide the pulse to temporarily inhibit the address decoder upon occurrence of the trailing edge of a microprocessor control pulse received at the input of the circuit.

2. The circuit of claim 1 wherein the means for producing said electrical delay comprises a series of inverters coupled together to provide the electrical delay.

3. The pulse generating circuit of claim 2 wherein the means for producing said delay includes an even number of inverters coupled in series.

4. The pulse generating circuit of claim 3 wherein the pulse to temporarily inhibit said address decoder has a duration which is set by the delay obtained from the means for producing said electrical delay, and wherein the delay obtained from the means for producing said electrical delay is dependent upon physical size of the inverters.

5. A pulse generating circuit coupled to an address decoder to provide an address enable signal to the address decoder, the address decoder being coupled to address lines of a random access memory, the pulse generating circuit comprising: means for providing a delay to an input pulse, the means for providing said delay having an output; a first logic gate coupled to the output of the means for providing said delay and also having at least an input to receive the input pulse and having an output; and a second logic gate coupled to the output of the first logic gate and also having at least an input coupled to the input pulse, the second logic gate providing at the output thereof the address enable signal to the address decoder until occurrence of the trailing edge of the input pulse and then generating a inhibiting pulse to the address decoder to cause the address decoder to set the address lines to a nonaddressing state in response to the inhibiting pulse.

6. The pulse generating circuit of claim 5 wherein the first and second logic gates are NOR gates.

7. The pulse generating circuit of claim 6 wherein the means for providing a delay comprises said plurality of inverters arranged in series to provide the delay.

8. The pulse generating circuit of claim 5 wherein the first logic gate also receives a third input derived from a memory enable signal so that the output of said first logic gate can be gated by said memory enable signal so as to effectively gate the address enable signal therewith.

* * * * *

UNITED STATES PATENT AND TRADEMARK OFFICE
CERTIFICATE OF CORRECTION

PATENT NO. : 4,328,558
DATED : May 4, 1982
INVENTOR(S) : Fuad H. Musa et al

It is certified that error appears in the above—identified patent and that said Letters Patent is hereby corrected as shown below:

Column 10, line 1, insert --provide-- before "at".

Column 10, line 2, insert --pulse-- before "generating" and delete "provide" after "circuit".

Column 10, line 33, change "a" to --an--.

Column 10, line 40, change "a" to --said--; and change "said" to --a--.

Signed and Sealed this

Twenty-sixth Day of October 1982

[SEAL]

Attest:

GERALD J. MOSSINGHOFF

Attesting Officer

Commissioner of Patents and Trademarks